(12) United States Patent
Bakli et al.

(10) Patent No.: US 6,319,766 B1
(45) Date of Patent: Nov. 20, 2001

(54) METHOD OF TANTALUM NITRIDE DEPOSITION BY TANTALUM OXIDE DENSIFICATION

(75) Inventors: Mouloud Bakli, Crolles (FR); Steve G. Ghanayem, Los Altos; Huyen T. Tran, Sunnyvale, both of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/510,582

(22) Filed: Feb. 22, 2000

(51) Int. Cl.[7] .............................................. H01L 21/8242
(52) U.S. Cl. .................. 438/240; 438/396; 438/608; 438/635; 438/660; 438/663; 438/785
(58) Field of Search ...................... 438/240, 396, 438/608, 635, 660, 663, 785

(56) References Cited

U.S. PATENT DOCUMENTS

| | | | |
|---|---|---|---|
| 4,464,701 | * 8/1984 | Roberts et al. | 361/313 |
| 4,782,380 | 11/1988 | Shankar | 357/71 |
| 4,886,966 | 12/1989 | Matsunaga et al. | 250/288 |
| 5,110,637 | * 5/1992 | Ando et al. | 428/34 |
| 5,336,638 | * 8/1994 | Suzuki et al. | 438/240 |
| 5,352,623 | 10/1994 | Kamiyama | 437/52 |
| 5,399,435 | * 3/1995 | Ando et al. | 428/428 |
| 5,508,221 | 4/1996 | Kamiyama | 437/60 |
| 5,514,485 | * 5/1996 | Ando et al. | 428/702 |
| 5,677,015 | 10/1997 | Hasegawa | 427/576 |
| 5,688,724 | * 11/1997 | Yoon et al. | 438/778 |
| 5,696,617 | * 12/1997 | Ohkawa et al. | 359/216 |
| 5,800,857 | * 9/1998 | Ahmad et al. | 427/80 |
| 5,872,696 | * 2/1999 | Peters et al. | 361/305 |
| 5,980,977 | * 11/1999 | Deng et al. | 427/79 |
| 5,989,999 | 11/1999 | Levine et al. | 438/627 |
| 6,087,261 | * 7/2000 | Nishikawa et al. | 438/685 |
| 6,162,744 | * 12/2000 | Al-Shareef et al. | 438/785 |
| 6,165,834 | * 12/2000 | Agarwal et al. | 438/240 |

OTHER PUBLICATIONS

M. Deery, K. H. Goh, K. G. Stephens and I. H. Wilson, "Reactive Ion Bombardment of Tantalum Thin Film Resistors," *Thin Solid Films*, 17 (1973) pp. 59–67.

* cited by examiner

Primary Examiner—John F. Niebling
Assistant Examiner—Lynne A. Gurley
(74) Attorney, Agent, or Firm—Moser, Patterson & Sheridan, L.L.P.

(57) ABSTRACT

The invention provides a method for forming a metal nitride film by depositing a metal oxide film on the substrate and exposing the metal oxide film to a nitrating gas to densify the metal oxide and form a metal nitride film. The metal oxide film is deposited by the decomposition of a chemical vapor deposition precursor. The nitrating step comprises exposing the metal oxide film to a thermally or plasma enhanced nitrating gas preferably comprising nitrogen, oxygen, and anunonia. The invention also provides a process for forming a liner/barrier scheme for a metallization stack by forming a metal nitride layer over the substrate by the densification of a metal oxide layer by a nitrating gas depositing a metal liner layer. Optionally, a metal liner layer may be deposited over substrate prior to the metal nitride layer to form a metal/metal nitride liner/barrier scheme. The invention firer provides a process to form a microelectronic device comprising forming a first electrode, forming a metal nitride layer over the first electrode by densifying a metal oxide layer by a nitrating gas to form a metal nitride layer, depositing a dielectric layer over the metal nitride layer, and forming a second electrode over the dielectric layer. Alternatively, the metal nitride film may comprise the first and second electrodes.

23 Claims, 6 Drawing Sheets

METHOD OF TANTALUM NITRIDE DEPOSITION BY TANTALUM OXIDE DENSIFICATION

BACKGROUND OF THE INVENTION

1. Field of the Invention

The present invention generally relates to the fabrication of integrated circuits and other electronic devices. More particularly, the invention relates to a method for depositing a metal nitride film.

2. Background of the Related Art

Reliably producing sub-half micron and smaller features is one of the key technologies for the next generation of very large scale integration (VLSI) and ultra large scale integration (ULS) integrated circuits. However, the shrinking dimensions of interconnects in VLSI and ULSI technology has placed additional demands on processing capabilities. The multilevel interconnect features that lie at the heart of this technology require careful processing of high aspect ratio features, such as vias, lines, contacts, and other interconnects. Reliable formation of these interconnect features is very important to the VLSI and ULSI success and to the continued effort to increase circuit density and quality of individual substrates and die.

As circuit densities increase, the widths of vias, contacts and other features, as well as the dielectric materials between them, decrease to sub-micron dimensions, i.e., 0.5 µm or less, whereas the thickness of the dielectric layers remains substantially constant, with the result that the aspect ratios for the features, ie., their height divided by width, increases. Many traditional deposition processes have difficulty filling sub-micron structures where the aspect ratio exceed 4:1, and particularly where it exceeds 10:1. Therefore, there is a great amount of ongoing effort being directed at the formation of void-free, sub-micron features having high aspect ratios.

One such component that faces the difficulties of forming high aspect ratio features are Dynamic random-access memory (DRAM) integrated circuits which are commonly used for storing data in a digital computer. Currently available DRAMs may contain over 16 million cells fabricated on a single crystal silicon chip, where each memory cell generally comprises a single access transistor connected to a trench capacitor. The access transistor is typically disposed above a trench capacitor to minimize the chip space occupied by the DRAM device. The trench capacitor is typically defined by a high aspect ratio trench structure etched in the substrate. The substrate, typically a doped P+ type, serves as the first electrode of the trench capacitor and is typically connected to a ground connection. The interior surfaces of the trench structure are covered by a composite dielectric film, such as a composite film of $SiO_2/Si_3N_4/SiO_2$, which serves as the dielectric for the capacitor. The trench structure is typically filled with a doped N+ polysilicon that serves as the second electrode of the capacitor. The access transistor is typically connected to the second electrode of the trench capacitor.

To facilitate construction of increasingly higher density DRAMs with correspondingly smaller-sized memory cells, capacitor structures and materials that can store the charge in smaller chip space are needed. High dielectric constant (HDC) materials (defined herein as having a dielectric constant greater than about 40) have been used successfully in high density trench capacitor structures in DRAMs to store charges. One such HDC material, tantalum oxide, $Ta_2O_5$, has become a promising choice for the next generation of high density memory cells. To form $Ta_2O_5$ films with high dielectric constants, a $Ta_2O_5$ layer is deposited and then annealed to enhance crystallization, thereby increasing the film's dielectric constant. An adhesion/encapsulation layer is deposited between an electrode surface and the $Ta_2O_5$ dielectric layer to improve interlayer adhesion of the $Ta_2O_5$ dielectric layer to adjacent materials during the anneal process. The adhesion/encapsulation layer also acts as a barrier layer to minimize interlayer diffusion that may cause degradation of the material properties of the device.

Traditional diffusion resistant materials with good adhesion properties, such as titanium nitride (TiN), have been used in integrated circuit manufacturing as liner/barrier layers generally and are currently being used as the adhesion/encapsulation material for the $Ta_2O_5$ dielectric layer in DRAMs. However, the use of TiN as the adhesion-lencapsulation material for the $Ta_2O_5$ dielectric layer has been problematic. One problem with TiN is that TiN has poor diffusion resistance properties at high temperatures, i.e., greater than about 350° C. In particular, it has been observed that TiN fails to prevent diffusion of adjacent materials into the $Ta_2O_5$ dielectric layer at temperatures greater than about 600° C. Temperatures greater than about 600° C. are required during the $Ta_2O_5$ layer thermal annealing process to generate higher dielectric constants. As such, TiN has not been a completely satisfactory adhesion/encapsulation material for use with $Ta_2O_5$. Other traditional materials, such as silicon nitride (SiN) have also been used as adhesion/encapsulation layers in DRAM manufacturing, however, SiN material has had similar material challenges as the TiN material.

Materials such as tantalum nitride (TaN) that have been observed to have greater diffusion resistance and higher thermal stability than TiN have been proposed for use as the adhesion/encapsulation material in DRAM manufacturing. However, TaN is conventionally deposited by reactive physical vapor deposition (PVD) techniques which are not well suited for covering the sides and bottom surfaces of high aspect ratio (>5:1) features, and may require more than one deposition regime to provide adequate coverage. Additionally, gaps may form in the TaN adhesion/encapsulation layer, and the TaN adhesion/encapsulation layer may have uneven thickness, resulting in some regions having insufficient thickness to adequately block diffusion between adjacent layers.

One proposed alternative to the PYD deposition of TaN adhesionlencapsulation layer is to deposit the barrier layer by a chemical vapor deposition (CVD) technique to provide good conformal coverage of substrate features. However, there are few commercially available TaN precursors, and the TaN precursors that are available produce films which have unacceptable levels of contaminants such as carbon and oxygen, and have poor diffusion resistance, low thermal stability, and undesirable film characteristics. Additionally, films deposited from the commercially available TaN precursors may suffer from poor adhesion to adjacent metal and dielectric layers which can cause interlayer defects, such as film delamination.

Therefore, there is a need for an adhesion/encapsulation material with good barrier properties that is useful for forming devices in sub-micron, high aspect ratio features. Particularly, there is a need for a process for depositing an adhesion/encapsulation material conformarly in sub-micron, high aspect ratio features, where the deposited adhesion/encapsulation material has low levels of contamination, and can withstand high temperatures during processing, particularly during annealing treatments of microelectronic devices having high dielectric constant materials.

SUMMARY OF THE INVENTION

The present invention provides a method of processing a substrate by forming a metal nitride film on a substrate in a processing chamber by the densification of an oxide film. In one aspect of the invention, a metal nitride film is formed by depositing a metal oxide film on the substrate and exposing the metal oxide film to a nitrating gas to form a metal nitride film. The metal nitride film is preferably tantalum nitride formed by nitrating a tantalum oxide film ($Ta_2O_5$) deposited by thermal or plasma enhanced decomposition of a chemical precursor, preferably selected from the group of pentaethoxytantalum cyclopentane tantalum azide, tantalum pentacloride, and combinations thereof. The nitrating gas may comprise nitrogen, ammonia, nitrous oxide, and combinations thereof, wherein the nitrating gas may further comprise reactive gases such as oxygen and hydrogen.

Another aspect of the invention provides for a method of forming a feature on a substrate by forming a metal nitride barrier layer in a metallization stack on the substrate by the densification of a CVD deposited metal oxide layer. In one embodiment, a dielectric layer is deposited on a substrate, the dielectric layer etched to form apertures in the dielectric layer to expose the substrate, and then a metal oxide layer is deposited on the metal layer and exposed to a nitrating gas to densify the metal oxide layer and nitrate a portion of the underlying metal layer to form a metal nitride layer. The densification of the metal oxide layer may be performed by a thermal annealing process or by a plasma treatment in a nitrogen containing atmosphere. A conductive metal, such as copper, may then be deposited on the metal nitride layer. Further, a metal layer of tantalum is deposited by either a physical vapor deposition (PVD) technique or a chemical vapor deposition technique, on the substrate prior to depositing the metal nitride layer to provide a liner/barrier layer scheme for the metallization stack.

Another aspect of the invention provides a method for forming a microelectronic device comprising forming a first electrode, depositing an adhesion or encapsulation layer comprising a metal nitride over the first electrode by the densification of a CVD deposited metal oxide layer, depositing a dielectric layer over the adhesion or encapsulation layer, and forming a second electrode over the dielectric layer. The method may further comprise depositing a second adhesion or encapsulation layer comprising a metal nitride between the dielectric layer and the second electrode, wherein the metal nitride of the encapsulation layer is formed by the densification of a CVD deposited metal oxide layer. Preferably, the dielectric layer is a high dielectric constant material, such as a metal oxide, deposited by the decomposition of a chemical precursor. Preferably, the adhesion layer and the dielectric layer are deposited sequentially in the same chamber from the same precursor with the adhesion layer comprising a metal nitride formed by the densification of a CVD deposited metal oxide layer. Alternatively, the metal nitride layer may comprise the first and second electrodes.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

The invention generally provides a process and apparatus for depositing a metal nitride film, forming a feature on a substrate, and forming a microelectronic device with a metal nitride film by the densification of a CVD deposited metal oxide film by a nitrating gas. In one aspect, a metal nitride film is formed on a substrate in a processing chamber by depositing a metal oxide film on the substrate and exposing the metal oxide film to a nitrating gas to form a metal nitride film. The metal oxide film is deposited by the chemical vapor deposition of a metal containing precursor. In one preferred embodiment of the invention, the metal nitride is tantalum nitride ($Ta_xN_y$) formed by exposing a tantalum oxide ($Ta_2O_5$) layer to a nitrating gas composed of nitrogen, ammonia, nitrous oxide, and combinations thereof, which may further include reactant gases such as hydrogen and oxygen. The nitrating step may be a thermal or a plasma enhanced process.

Another aspect of the invention provides for a method of forming a feature on a substrate by forming a metal nitride barrier layer in a metallization stack on the substrate by the densification of a CVD deposited metal oxide layer. A further aspect of the invention provides a method for forming a microelectronic device comprising forming a first electrode, depositing an adhesion layer comprising a metal nitride over the first electrode by the densification of a CVD deposited metal oxide layer, depositing a dielectric layer over the adhesion layer, and forming a second electrode over the dielectric layer. Alternatively, the metal nitride layer may comprise the first and second electrodes.

The Apparatus

Figure 1:
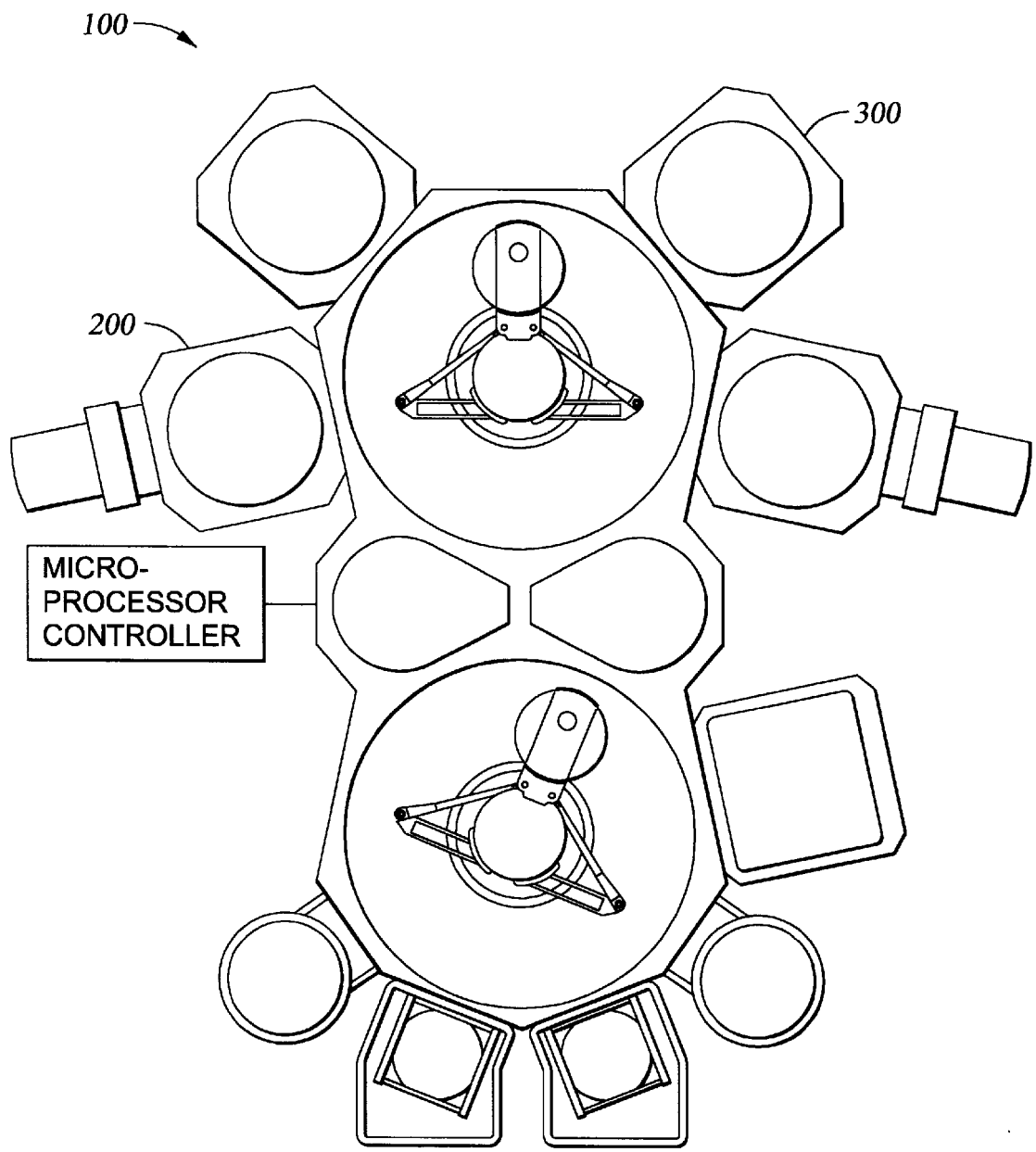
FIG. 1 is a schematic top view of an integrated multi-chamber apparatus suitable for performing CVD and PVD processes on a substrate.

The processes of the invention described above may be performed in a multichamber processing apparatus or cluster tool having both PVD and CVD chambers. A schematic of a multichamber processing apparatus 100 suitable for performing the CVD and PVD processes of the present invention is illustrated in FIG. 1. The apparatus shown in FIG. 1 is an ENDURA™ system commercially available from Applied Materials, Inc., Santa Clara, Calif. A similar staged-vacuum wafer processing system is disclosed in U.S. Pat. No. 5,186,718, entitled Staged-Vacuum Wafer Processing System and Method, Tepman et al., issued on Feb. 16, 1993, which is hereby incorporated herein by reference. The particular embodiment of the apparatus 100 shown herein is suitable for processing planar substrates, such as semiconductor substrates, and is provided to illustrate the invention, and should not be used to limit the scope of the invention. The apparatus 100 typically comprises a cluster of interconnected process chambers, for example, a CVD chamber 300, and a PVD chamber 200.

The apparatus 100 preferably includes at least one PVD chamber 200 for performing PVD processes. For example, the metal oxide dielectric layer of the invention may be deposited by sputtering a target of metal in an oxidizing atmosphere in the PVD chamber. The target is electrically isolated from the chamber and serves as a process electrode for generating a plasma. During the sputtering process, a sputtering gas, such as argon or xenon, is introduced into the chamber 200. Power applied to the sputtering target ionizes the gases within the chamber to form a plasma. The power provided to the target may be DC or RF power, with the substrate support electrically grounded. The plasma is typically generated by applying a DC or RF voltage at a power level from between about 100 and about 20,000 Watts, and more typically from between about 100 and about 10,000 Watts, to the sputtering target.

Figure 2:
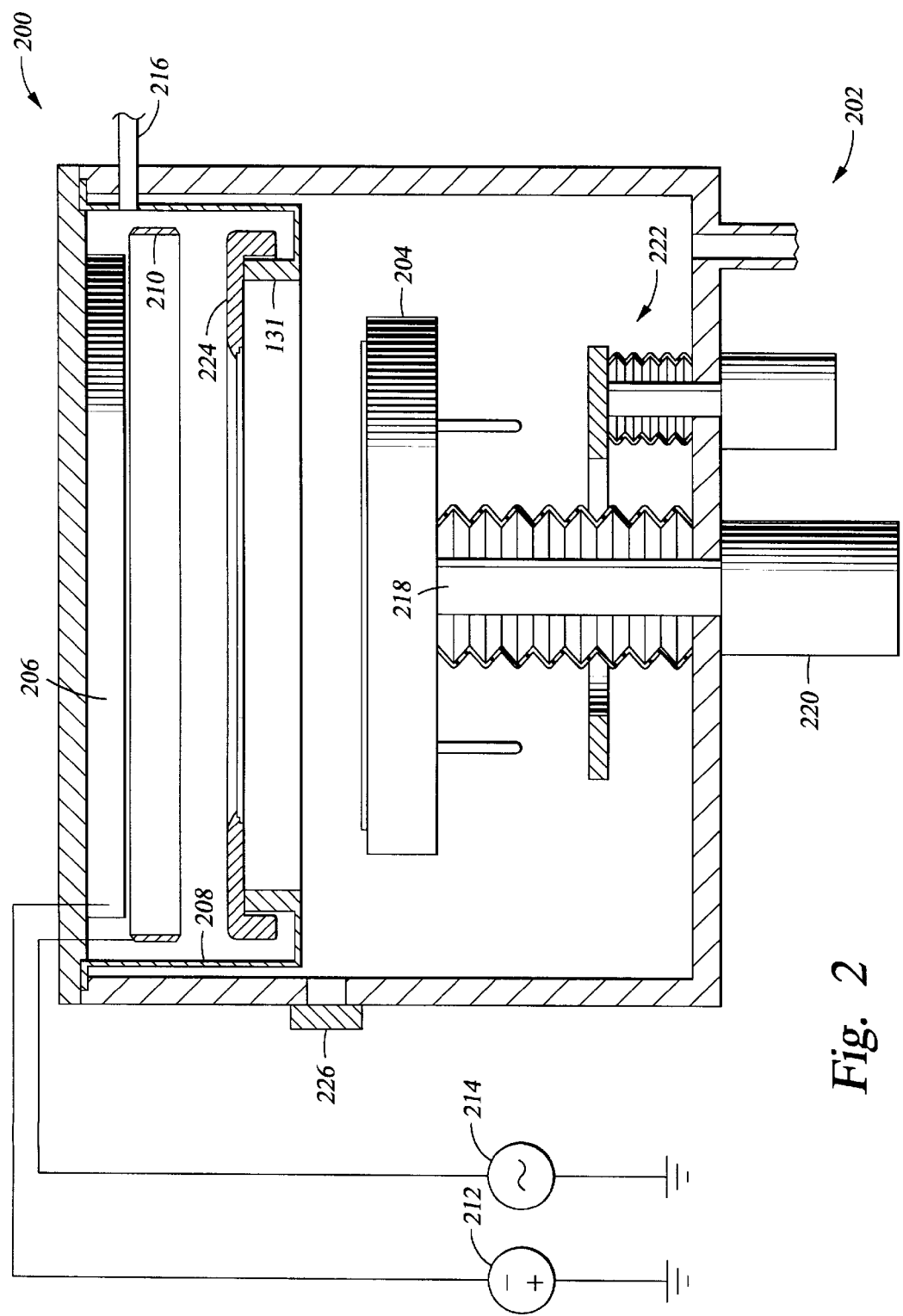
FIG. 2 is a high density plasma physical vapor deposition chamber useful for forming the a metal layer of the present invention.

FIG. 2 is a schematic view of an exemplary physical vapor deposition (PVD) chamber for use with the invention. The exemplary PVD chamber is a high density plasma PVD (HDP-PVD) chamber, such as the IMP® PVD chamber available from Applied Materials, Inc., Santa Clara, Calif.. The HDP-PVD chamber 200 generally includes a chamber enclosure 202, a substrate support member 204, a target 206, a shield 208 and a coil 210. The target 206 is disposed opposite the substrate support member 204 and is electrically connected to a DC power supply 212. The shield 208 generally surrounds the region between the target 206 and the substrate support member 204 and is typically grounded. The coil 210 is disposed interior of the shield 208 and is connected to an RF power supply 214. A gas inlet 216 disposed through the enclosure 202 introduces one or more processing gases into the chamber during processing.

The substrate support member 204 is attached to an actuator shaft 218 disposed through the bottom of the enclosure 202. The actuator shaft 218 is connected to an actuator 220 which facilitates movement of the substrate support member 204 to various positions in the chamber. A slit valve 226 disposed on a sidewall of the enclosure 202 facilitates transfer of substrates into and out of the chamber. A substrate lift assembly 222 disposed relative to the substrate support member 204 facilitates positioning of a substrate onto and off of the substrate support member 204. During processing, the substrate support member 204 positions a substrate below a cover ring 224 disposed on a lower portion of the shield 208 to shield the perimeter edge of the substrate from deposition.

Figure 3:
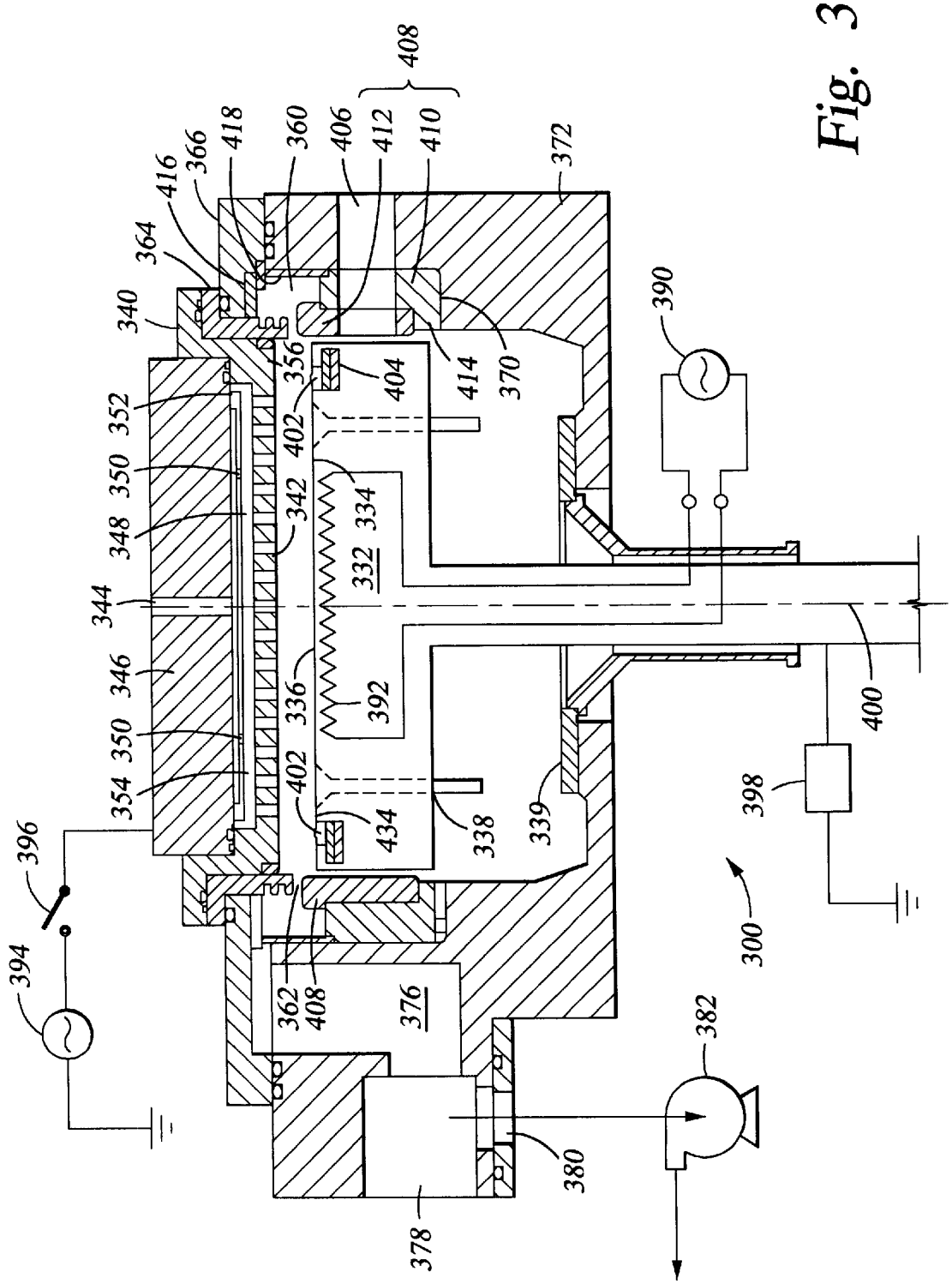
FIG. 3 is a schematic cross-sectional view of a CVD chamber suitable for performing the CVD deposition processes of the present invention chamber from a co-pending patent application assigned of the subject patent application.

FIG. 3 is a schematic cross-sectional view of an exemplary CVD chamber useful for performing the processes of the invention. The CVD chamber shown is a CVD TxZ™ chamber, commercially available from Applied Materials, Inc., of Santa Clara, Calif. The TxZ™ chamber is suitable for the deposition of a metal containing precursor of the present invention in the presence of a reactant gas for depositing a metal oxide and/or metal nitride film by either a thermal or plasma enhanced decomposition process.

In the thermal deposition process, a precursor gas is injected into the chamber through the showerhead 340 at a pressure of between about 100 milliTorr and about 10 Torr while the pedestal 332 supports and heats the substrate 336 to an elevated temperature above the decomposition temperature of the precursor of about 100° C. or higher, and preferably from between about 250° C. and about 450° C. The reactant gas is introduced to the precursor gas in the volume located directly above the substrate. A conductive and conformal metal and/or metal nitride layer is conformally deposited on the substrate 336.

In case where a plasma is desired during the deposition process or as a post deposition plasma treatment to remove impurities and densify the film, sufficient voltage and power is applied by an RF power source 394 to cause the process gas in the processing region 356 between the showerhead 340 and the pedestal 332 to discharge and to form a plasma.

The CVD chamber 300 includes a pedestal 332 to support a substrate 336 on a supporting surface 334. lift pins 338 are slidable within the pedestal 332 but are kept from falling out by conical heads on their upper ends. The lower ends of the lift pins 338 are engageable with vertically movable lifting ring 339 and thus can be lifted above the surface 334 of the pedestal 332. With pedestal 332 in a lower loading position (slightly lower than a slit valve identified as "406" below), a robot blade (not shown) in cooperation with the lift pins 338 and the lifting ring 339 transfers the substrate 336 in and out of the chamber 300 through the slit valve 406, which can be vacuum-sealed to prevent the flow of gas into or out of the chamber through slit valve 406. Lift pins 338 raise an inserted substrate 336 off the robot blade, and then the pedestal 332 rises to transfer the substrate 336 the lift pins 338 onto the supporting surface 334 of the pedestal 332. A suitable robotics transfer assembly is described in commonly-assigned U.S. Pat. No. 4,951,601, issued to Maydan, the complete disclosure of which is incorporated herein by reference.

Through the use of a self-aligning lift mechanism, the pedestal 332 then further raises the substrate 336 into close opposition to a gas distribution faceplate 340, often referred to as a showerhead, which includes a larger number of passageways 342 for jetting the process gas to the opposed substrate 336. The process gas is injected into the reactor 300 through a central gas inlet 344 in a gas-feed cover plate 346 to a first disk-shaped space or void 348 and from thence through passageways 350 in a baffle plate (or a gas blocker plate) 352 to a second disk-shaped space or void 354 in back of the showerhead 340. The showerhead 340 includes a large number of holes or passageways 342 for jetting the process gas into a processing space or zone 356. More specifically, process gas passes from the space or void 354, through the passageways 342 and into the processing space or zone 356 and towards the substrate 336.

The process gas jets from the holes 342 in the showerhead 340 into the processing space or zone 356 between the showerhead 340 and pedestal 332 so as to react at the surface of the substrate 336. The process gas byproducts subsequently flow radially outwardly with respect to a central axis 400 across the edge of the substrate 336, and across a peripheral centering right 402 which is disposed in an annular ledge 404 recessed in the upper periphery of a pedestal 332. Then into an annular pumping channel 360 surrounding the upper periphery of the pedestal 332 when pedestal 332 is in the processing position.

The pumping channel 360 is connected through a constricted exhaust aperture 362 to a pumping plenum 376, and a valve 378 gates the exhaust through an exhaust vent 380 to a vacuum pump 382. The restricted choke aperture 362 creates a nearly uniform pressure around the circumferential pumping channel 360. The process gas and its reaction byproducts flow from the center of the showerhead 340 across the substrate 336 and the periphery of the pedestal 332 and then through the choke aperture 362 to the pumping channel 360. The gas then flows circumferentially in the pumping channel 360 to the exhaust aperture 374 and then through the exhaust plenum 376 and the exhaust vent 380 to the vacuum pump 382. Because of the restriction 362 the gas flow across the substrate 336 is nearly uniform in the azimuthal direction.

As shown in FIG. 3, the ledge 370 in the chamber body 372 supports an insulating annular chamber insert 408 composed of a insulating chamber ring 410 and a band shield 412, which forms the bottom of the pumping channel 360. The chamber lid rim 366 forms the top and part of the outside wall of the pumping channel 360 along with the part of the chamber body 372. The inside upper edge of the pumping channel 360 is formed by the isolator ring 364, which is made of a ceramic or other electrically insulating material which insulates the metallic showerhead 340 from the chamber body 372.

The CVD reactor 300 of FIG. 3 can be operated in a thermal and a plasma assisted mode. In the thermal mode, an electrical power source 390 supplies power to a resistive heater 392 at the top of the pedestal 332 to thereby heat the pedestal 332 and thus the substrate 336 to an elevated temperature sufficient to thermally activate the CVD deposition reaction. In the plasma-enhanced mode, an RP electrical source 394 is passed by a switch 396 to the metallic showerhead 340, which thus acts as an electrode. The showerhead 340 is electrically insulated from the lid rim 366 and the main chamber body 372 by the annular isolator ring 364, typically formed of an electrically non-conductive ceramic. The pedestal 332 is connected to a biasing element 398 associated with the RF source 394 so that RF power is split between the showerhead 340 and the pedestal 332. Sufficient voltage and power is applied by the RF source 394 to cause the process gas in the processing region 356 between the showerhead 340 and the pedestal 332 to discharge and to form a plasma.

Figure 4:
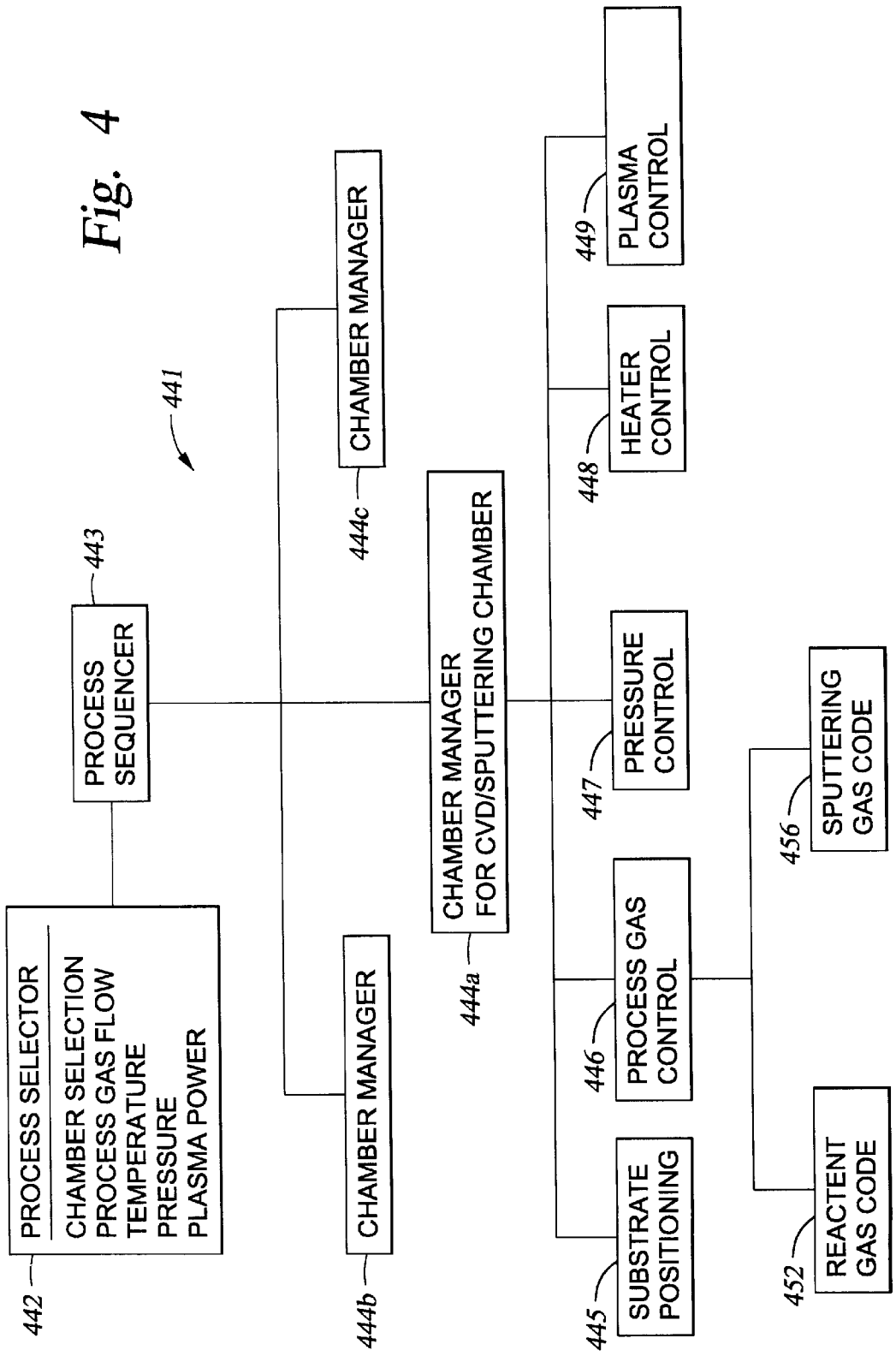
FIG. 4 is a simplified block diagram showing the hierarchical control structure of a computer program of the present invention.

FIG. 4 shows an illustrative block diagram of the hierarchical control structure of the computer program 441. A user enters a process set number and process chamber number into a process selector subroutine 442 in response to menus or screens displayed on the CRT monitor by using the light pen interface. Tile process sets are predetermined sets of process parameters necessary to carry out specified processes, and are identified by predefined set numbers. Process selector subroutine 442 identifies (i) the desired process chamber in a multi-chamber system, and (ii) the desired set of process parameters needed to operate the process chamber for performing the desired process. The process parameters for performing a specific process relate to process conditions such as, for example, process gas composition and flow rates, temperature, pressure, plasma conditions such as RF power levels, and chamber dome temperature, and are provided to the user in the form of a recipe. The parameters specified by the recipe are entered utilizing a light pen/CRT monitor interface (not shown).

A process sequencer subroutine 443 comprises program code for accepting the identified process chamber and set of process parameters from the process selector subroutine 442, and for controlling operation of the various process chambers. Multiple users can enter process set numbers and process chamber numbers, or a user can enter multiple process set numbers and process chamber numbers, so the sequencer subroutine 443 operates to schedule the selected processes in the desired sequence. Preferably the sequencer subroutine 443 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, the sequencer subroutine 443 can be designed to take into consideration the present condition of the process chamber being used in comparison with the desired process conditions for a selected process, or the "age" of each particular user entered request, or any other relevant factor a system programmer desires to include for determining scheduling priorities.

After sequencer subroutine 443 determines which process chamber and process set combination is going to be executed next, sequencer subroutine 443 causes execution of the process set by passing the particular process set parameters to a chamber manager subroutine 444A–C, which controls multiple processing tasks in PVD chamber 300 and possibly other chambers (not shown) according to tile process set determined by sequencer subroutine 443.

Once the sequencer subroutine 443 determines which process chamber and process set combination is going to be executed next, the sequencer subroutine 443 causes execution of the process set by passing the particular process set parameters to the chamber manager subroutines 444A–C which control multiple processing tasks in different process chambers according to the process set determined by the sequencer subroutine 443. For example, the chamber manager subroutine 444A comprises program code for controlling PVD process operations, within the described process chamber 300 of FIG. 3.

The chamber manager subroutine 444 also controls execution of various chamber component subroutines or program code modules, which control operation of the chamber components necessary to carry out the selected process set. Examples of chamber component subroutines are substrate positioning subroutine 445, process gas control subroutine 446, pressure control subroutine 447, heater control subroutine 448, and plasma control subroutine 449 Those having ordinary skill in the art will recognize that other chamber control subroutines can be included depending on what processes are desired to be performed in chamber 300 (shown in FIG. 3). In operation, chamber manager subroutine 444A selectively schedules or calls the process component subroutines in accordance with the particular process set being executed. Scheduling by chamber manager subroutine 444A is performed in a manner similar to that used by sequencer subroutine 443 in scheduling which process chamber and process set to execute. Typically, chamber manager subroutine 444A includes steps of monitoring the various chamber components, determining which components need to be operated based on the process parameters for the process set to be executed, and causing execution of a chamber component subroutine responsive to the monitoring and determining steps.

The Densification Process

The metal nitride film is formed by a nitrating densification of a metal oxide film deposited, preferably conformally, by a thermal or a plasma enhanced decomposition of a metal containing precursor. For depositing a tantalum oxide ($Ta_2O_5$), a tantalum containing precursor selected from the group of pentaethoxytantalum ($Ta(OC_2H_5)_5$), cyclopentane tantalum azide, tantalum pentachloride ($TaCl_5$), and combinations thereof is preferably used. Other tantalum oxide precursors or processes which may be used to deposit a tantalum oxide or metal oxide film are contemplated by the invention. For example, an oxidizing gas, such as oxygen, can be used with a metal oxide precursor that does not contain an oxygen component, such as tantalum pentacloride, or with an oxygen containing precursors, such as pentaethoxytantalum, to enhance deposition of the metal oxide film.

During the metal oxide deposition process, the substrate is heated and maintained at a temperature sufficiently high to cause decomposition of the metal oxide precursor and deposition of the film. The exact temperature will depend upon the identity and chemical, thermal, and stability makeup of the compound or compounds used under the reaction conditions. However, a temperature from about room temperature to about 1000° C., preferably from between about 100° C. and about 800° C., and most preferably between about 250° C. and about 500° C. is used to ensure a complete deposition of the precursor on the substrate surface. The processing chamber is maintained at a pressure between about 1 milliTorr and about 25 Torr, but preferably from between about 100 milliTorr and about 10 Torr during the deposition process.

For plasma-enhanced CVD deposition of the metal oxide precursor, power to generate a plasma is then either capacitively or inductively coupled into the chamber to excite the gases into a plasma state to form excited species which react with the film deposited on the substrate. Power is provided to die chamber at between about 200 and about 1000 Watts. For a plasma enhanced deposition process, the substrate temperature is maintained between about 100° C. and about 800° C., preferably between about 250° C. and about 500° C., with chamber pressure maintained at between about 100 milliTorr and about 10 Torr during the plasma enhanced deposition process. The plasma enhanced decomposition of the precursor allows for an increased deposition rate, particularly in combination with a reactant gas, at a lower processing temperature than the thermal decomposition.

Metal oxide films deposited by chemical vapor deposition techniques, and particularly in the case of organometalfic precursors, may contain organic contaminants, such as carbon and hydrogen. The carbon and hydrogen contaminants may have concentrations in the film of up to about 20% by weight in the deposited films. Nitrogen containing gases, preferably nitrogen, nitrous oxide, and/or ammonia may be introduced during the metal oxide precursor decomposition to reduce contaminant concentrations and form metal oxynitride films.

Once deposited, the metal oxide (or metal oxynitride) film is then converted into a metal nitride by exposing the film to a nitrating gas, and densifying the film by supplanting oxygen and other components with nitrogen. The nitrating gases which may be used to perform the densification include oxygen ($O_2$), nitrogen ($N_2$), nitrous oxide, and ammonia ($NH_3$). The nitrating gas comprises at least nitrogen and ammonia, but preferably comprises a mixture of oxygen, nitrogen, and ammonia. If nitrogen is used as the nitrating gas without ammonia, the nitrating gas also may include hydrogen.

The nitrating process can be enhanced either thermally or by a plasma process. In a thermally enhanced nitrating process, the deposited metal oxide film is exposed to the nitrating gas with the processing chamber having a temperature between about 200° C. and about 800° C., at a chamber pressure of between about 1 milliTorr and about 25 Torr. The thermal process may be performed in the same processing chamber used for the metal oxide deposition, or may be performed by annealing the metal oxide film in a nitrating gas at a temperature of between about 200° C. and about 800° C. for a period of between about 30 seconds and about 180 seconds in a rapid thermal annealing process (RTP). An example of an anneal chamber is the RTP XFplus Centura® available from Applied Materials, Inc., Santa Clara, Calif. Alternatively, the film may also be annealed at a temperature between about 300° C. and about 600° C. for a period of time between about 5 minutes and about 50 minutes in a conventional annealing process chamber.

The metal oxide film can also be nitrated by a plasma process. For the plasma process, the nitrating gases are introduced into the processing chamber to establish a pressure between about 1 milliTorr and about 25 Torr, but preferably between about 1 Torr and about 10 Torr, and more preferably the chamber pressure is between about 1.5 Torr and about 6 Torr. The substrate is maintained at a temperature of between about 200° C. and about 800° C., preferably between about 250° C. and about 500° C. Power to generate a plasma is imparted to the processing gases at between about 25 Watts and about 2000 Watts, preferably between about 500 Watts and about 1000 Watts, and more preferably at about 750 Watts. While the above described processes are considered exemplary for the densification of metal oxide films, other techniques, such as remote microwave dissociation of the nitrating gases to produce reactive species for the nitrating process are also contemplated.

Metal nitride films have been shown to have superior barrier properties to both metal and metal oxide films and can exist in conductive and insulative phases depending upon the amount of nitration. Nitrating the film also reduces the concentration of contaminants in the film as nitrogen removes hydrogen and carbon from the layer as volatile hydrocarbons and oxygen are desorbed from the surface during the thermal or plasma process. The nitration/densification process will densify the film, thereby improving barrier characteristics and removing layering defects. Nitrating the film will also impart a crystalline structure to the amorphous layer, thereby enhancing interfacial bonding and adhesion while reducing interlayer defects with other crystalline layers, such as metal and metal oxide layers in metallization schemes. Additionally, the CVD process deposition of the metal nitride layer is generally observed to have better conformal coverage in the high aspect ratio features and superior step coverage than metal nitride films deposited by standard physical vapor deposition (PVD) processes.

Figure 5:
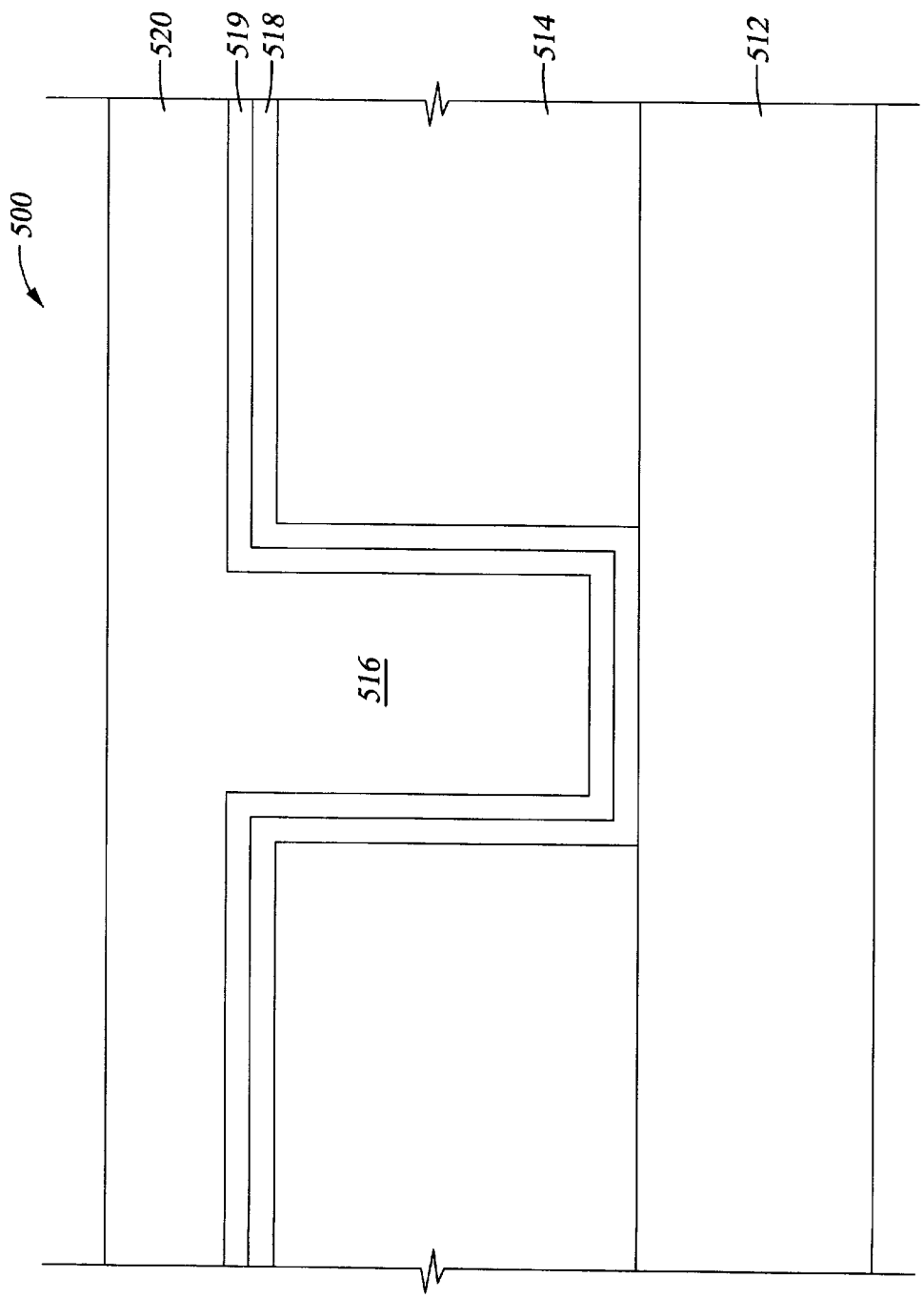
FIG. 5 is cross sectional views of an interconnect in a dielectric layer illustrating a metallization technique for forming such interconnects according to the invention.

In another aspect of the invention, the densification of a metal oxide film to form a metal nitride film may be used to advantage in a liner/barrier deposition process to form a metal nitride or metal/metal nitride barrier/liner scheme, such as a TaN or Ta/TaN scheme used in a copper metallization scheme. In an integrated liner/barrier metallization scheme of the invention, preferably, a metal layer is conformally deposited by a chemical vapor deposition (CVD) technique from the decomposition of a precursor. The metal layer is deposited as a liner layer to promote adhesion to the underlying material and reduce contact/via resistance. Alternatively, the metal layer may be deposited by a physical vapor deposition (PVD) technique, such as ionized metal plasma (IMP) or collimated PVD. However, tantalum nitride films have been observed to have good adhesive properties, and such a metal adhesion layer may not be used in the metallization scheme. A metal nitride is then formed by depositing a metal oxide film on the substrate by a chemical vapor deposition technique, exposing the metal oxide film to a nitrating gas, and nitrating the exposed metal oxide film to form a metal nitride film FIG. 5 is a schematic cross-sectional view of one embodiment of a metallized film stack 500 of the present invention having a liner layer 518, a barrier layer 519, and a conductive metal layer 520 deposited in a feature 516 formed on a substrate 512. The feature 516 is formed by depositing and etching a dielectric layer 514 on the substrate 512 to form the desired feature 516, such as a via, contact, trench or line. The substrate 512 may take the form of a silicon, thermal oxide, ceramic, or doped silicon substrate or it may be a first or subsequent electrically conducting layer or patterned lines formed on a substrate. The dielectric layer 514 may be a pre-metal dielectric layer deposited over a silicon wafer or an inter-level dielectric layer, and is formed in accordance with procedures conventionally known in the art to form a part of the overall integrated circuit. The dielectric layer 514 can be etched with any dielectric etching or patterning process known in the art, such as reactive ion etching.

For a metal/metal nitride liner/barrier scheme, the liner layer 518 preferably comprises tantalum conformably deposited on the dielectric layer 514 and on the floor and walls of the feature 516. The liner layer 518 may be deposited by chemical vapor deposition or physical vapor deposition techniques, preferably by CVD deposition of an tantalum containing precursor. The liner layer 518 improves adhesion between the substrate or dielectric layer 514 and the subsequently deposited conducting metal layer 520. The CVD tantalum is deposited on a substrate heated between about 100C and about 450C, and at a chamber pressure of between about 100 milliTorr and about 10 Torr. The tantalum liner layer 518 may also be deposited by a plasma enhanced CVD process where a plasma is generated by applying a power of between about 200 watts and about 1000 watts. For CVD deposited liner layers, the liner layer 518 is preferably exposed to a plasma of hydrogen and an inert gas, such as argon, to remove a carbon and oxygen impurities and to reduce the resistivity of the tantalum layer 518.

Alternatively, the liner layer 518 may be deposited by a PVD technique using the following processing parameters in a high density plasma physical vapor deposition (HDP-PVD) chamber used for IMP-PVD deposition techniques. The chamber pressure during the deposition process is preferably maintained between about 5 milliTorr and about 100 milliTorr, even more preferably between about 10 milliTorr and about 30 milliTorr. The target is preferably DC-biased at between about 1 kW and about 3 kW and between about 100 V and about 300 V. The coil is preferably RF-biased at between about 1 kW and about 3 kW. The substrate support member may be bias at between about 0 W and about 500 W and between about 50 V and about 300 V. In an alternative embodiment of the metallization stack 500, the liner layer 518 is not deposited and the barrier layer 519 performs as the liner layer to promote interlayer adhesion.

Thereafter, a metal nitride barrier layer 519 formed from the densification of a metal nitride layer is conformally deposited on the liner layer 518. The barrier layer 519 is deposited prior to the conductive metal layer 520 to prevent diffusion of the conductive metal layer 520 to the underlying substrate 512 or dielectric layer 514. The barrier layer 519 comprising TaN may be formed by first depositing a metal oxide layer by CVD deposition of a tantalum precursor to form a tantalum oxide layer. The tantalum oxide precursors may be selected from the group of pentaethoxytantalum $(Ta(OC_2H_5)_5)$, cyclopentane tantalum azide, tantalum pentacloride, $Ta(OCH_3)$, and combinations thereof. The tantalum oxide layer is then exposed to a nitrating reactant gas, such as nitrogen, nitrous oxide, or ammonia which may additionally include hydrogen, oxygen, or another reactive gases. The process may be thermally enhanced or plasma enhanced, to densify the tantalum oxide layer to form a tantalum nitride barrier layer 519. For a thermal nitrating process of the tantalum oxide layer, a nitrating processing gas, preferably a mixture of ammonia, nitrogen, and oxygen, is introduced into the chamber with a substrate maintained at a temperature between about 200° C. and about 800° C., and a chamber pressure of between about 1 milliTorr and about 25 Torr. The plasma nitrating process may be further enhanced by generating a plasma by applying between about 25 watts and about 2000 watts to the processing gases described above.

The nitrating gas may also nitrate the surface of the underlying tantalum liner layer 518. It is believed that nitrating the surface of the underlying tantalum liner layer 518 forms an improved atomic lattice bridge between the tantalum metal 518 and the tantalum nitride layer 519, resulting in stronger adhesive properties, improved resistance to chemical attack, improved resistance to inter-metal diffusion in the metallization stack at higher temperatures, and reduced particle formation at lower temperatures.

A layer of conductive metal 520, preferably aluminum, tungsten or copper, and most preferably copper, is deposited on the barrier layer 519. The conductive metal layer 520 is deposited to completely fill the interconnect 516. The copper layer 520 can be deposited by physical vapor deposition (PVD), ionized metal plasma (IMP) PVD, chemical vapor deposition (CVD), electroplating, electroless deposition, or any other known methods in the art.

The feature may be further processed by planarizing the top portion of the metallized layer stack 500, preferably by chemical mechanical polishing (CMP). During the planarization process, portions of the copper layer 518 and the dielectric layer 514 are removed from the top of the structure leaving a fully planar surface with a conductive feature formed in the via 516. Other subsequent processing can include annealing if desired, additional deposition of dielectric or metal layers, etching, and other processes known to IC manufacturing.

The present invention may also be used to advantage in forming microelectronic devices by forming a first electrode, depositing an adhesion or encapsulation layer comprising a metal nitride over the first electrode by the nitrating densification of a CVD deposited metal oxide layer, depositing a dielectric layer over the adhesion or encapsulation layer, and forming a second electrode over the dielectric layer. The method may further comprise depositing an adhesion or encapsulation layer comprising a metal nitride between the dielectric layer and the second electrode by nitrogen densification of a CVD deposited metal oxide layer. The dielectric layer being composed of a high dielectric constant material, preferably tantalum oxide. Although the invention is described in the application for a DRAM device having a trench capacitor, the inventors contemplate application of the invention in other semiconductor devices as well. Additionally, although the invention is described in the application for a tantalum oxide dielectric material, the inventors contemplate application of the invention to other high dielectric materials used in semiconductor manufacturing.

Figure 6:
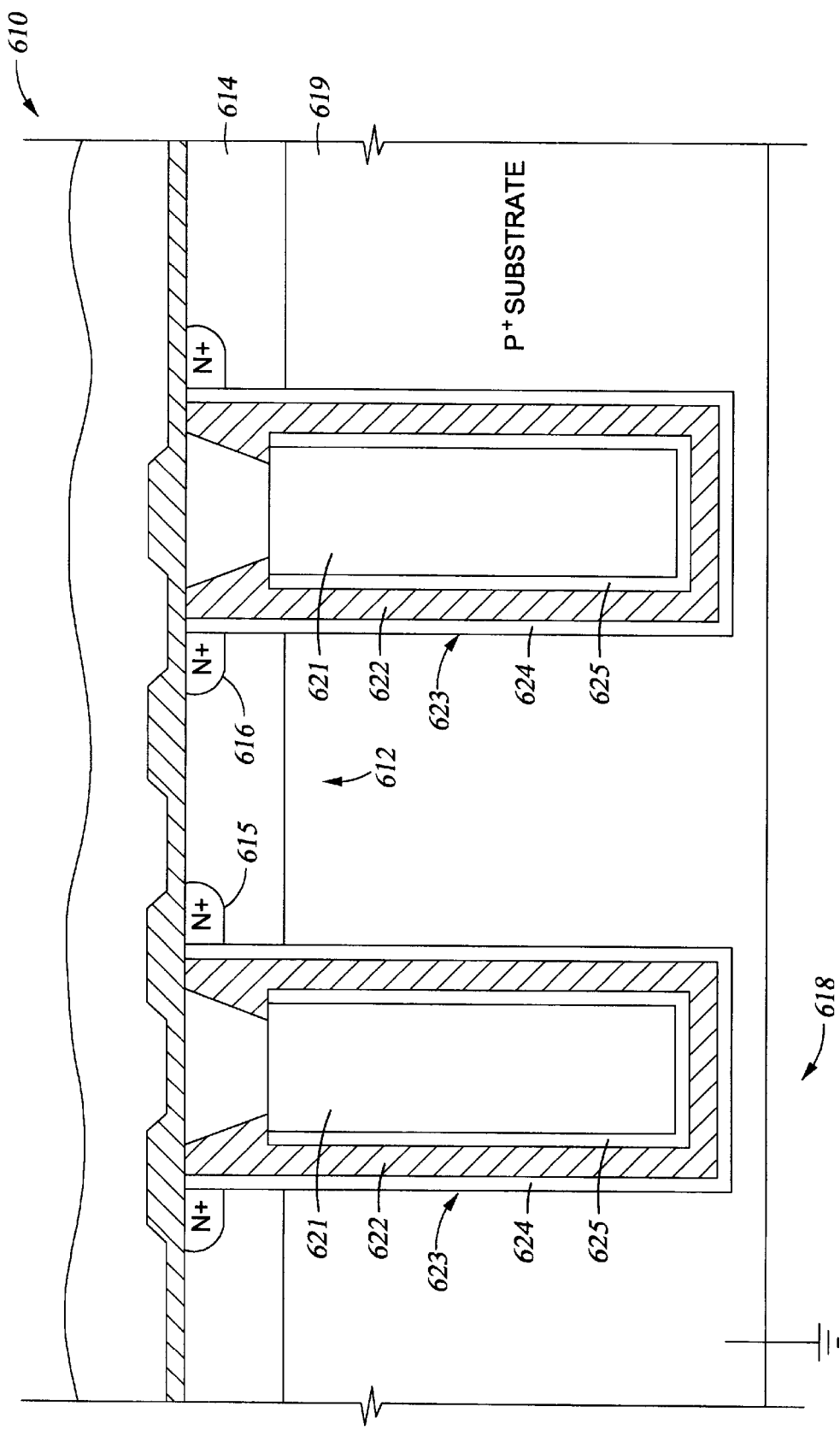
FIG. 6 is a cross sectional view of a DRAM device having a trench capacitor according to the invention.

FIG. 6 is a cross sectional view of a DRAM device having a trench capacitor formed using the methods of the invention. The DRAM device 610 is formed on a silicon substrate and generally comprises an access transistor 612 and a trench capacitor 618.

As shown in FIG. 6, the access transistor 612 for the DRAM device 610 is positioned adjacent a top portion of the trench capacitor 618. Preferably, the access transistor 612 comprises an n-p-n transistor having a source region 615, a gate region 614 and a drain region 616. The gate region 614 comprises a P-doped silicon epilayer disposed over the P+ substrate. The source region 615 of the access transistor 612 comprises an N+ doped material disposed on a first side of the gate region 614, and the drain region 16 comprises an N+ doped material disposed on a second side of the gate region 614, opposite the source region 15. The source region 615 is connected to an electrode of the trench capacitor.

The trench capacitor 618 generally comprises a first electrode 619, a second electrode 621 and a dielectric material 622 disposed therebetween. The P+ substrate serves as a first electrode 619 of the trench capacitor 618 and is connected to a ground connection. A trench 623 is formed in the P+ substrate and filled with a doped N+ polysilicon which serves as the second electrode 621 of the trench capacitor 618. The dielectric material 622 is disposed between the first electrode 619 (ie., P+ substrate) and the second electrode 621 (i.e., N+ polysilicon). Although the above-described DRAM device utilizes an n-p-n transistor, a P+ substrate as a first electrode and an N+ polysilicon as a second electrode of the capacitor, other transistor designs and electrode materials are contemplated by the invention to form DRAM devices. According to the invention, the trench capacitor 618 includes an first adhesion/encapsulation layer 624 disposed between the dielectric material 622 and the first electrode 619. Adhesion/encapsulation layers are defined herein to refer to layers that provide interlayer adhesion, encapsulation of materials to prevent interlayer diffusion, or layers that perform both functions. Preferably, a second adhesion/encapsulation layer 225 is also disposed between the dielectric material 622 and the second electrode 621. The trench capacitor 618 is formed in a high aspect ratio trench structure. The first electrode 619 of the trench capacitor comprises a doped substrate in which the high aspect ratio trench structure is etched. Once the trench structure has been etched on the substrate, the first adhesion/encapsulation layer 624 is deposited over the surfaces of the trench structure to improve the adhesion of the dielectric material 622 to the first electrode 619 (i.e., P+ substrate). The first and second electrodes 619, 621, may also comprise a conductive materials such as tantalum (Ta), tungsten (W), nitrated formed thereof ($Ta_xN_y$, $WN_x$) and compositions of conductive material and nitrated derivative thereof (Ta/$Ta_xN_y$, W/$WN_x$).

The first and second adhesion/encapsulation layers 624, 625 are deposited utilizing chemical vapor deposition techniques, such as by a metal organic chemical vapor deposition (MOCVD) technique, to form thin, conformal layers on the surfaces within high aspect ratio features. The first adhesion/encapsulation layer 624 comprises a metal nitride formed from the densification of a metal oxide layer by a nitrating reactant gas composed of ammonia, nitrogen, oxygen, and combinations thereof. The metal oxide may be deposited by the chemical vapor deposition of a metal containing precursor selected from the group of pentaethoxytantalum ($Ta(OC_2H_5)_5$), cyclopentane tantalum azide, tantalum pentacloride, $Ta(OCH_3)$, and combinations thereof. The metal nitride is a nitride of a heavy metal, preferably tantalum, that can be deposited as an metal oxide, such as tantalum oxide ($Ta_2O_5$) or metal oxynitride, such as tantalum oxynitride $Ta_xO_yN_z$. The metal oxide layer may be nitrated by heating the layer to a temperature of between about 200° C. and about 800° C. in a nitrating gas environment or by striking a plasma of a nitrogen containing gas. The plasma can be generated by capacitively or inductively coupling energy into a processing chamber at a power between about 25 and about 2000 Watts.

The first adhesion/encapsulation layer 624 is deposited to a thickness of between about 50 Å and about 500 Å for a feature having an aperture width less than about 0.25 μm and an aspect ratio greater than about 5:1. For example, the first adhesion/encapsulation layer 624 is deposited to about 300 Å for a feature having dimensions of about 0.25 μm wide and about 2.5 μm deep. The adhesion/encapsulation layer 624 is also useful as a bottom electrode in a microelectronic device because the adhesion/encapsulation layer 624 provides sufficient electrical conductivity. Thus, the electrode gate material and the adhesion/encapsulation layer 624 for the dielectric layer are deposited with one process to improve efficiency and throughput of the system. Preferably, the bottom electrode having the material according to the invention has a resistivity, ρ, less than about 500 μΩ-cm, and even more preferably, less than about 250 μΩ-cm.

Referring again to FIG. 6, after the adhesion/encapsulation layer 624 has been deposited over the surfaces of the trench structure, the dielectric layer 622 is deposited over the adhesion layer 624. Preferably, the dielectric layer 622 comprises a high dielectric metal oxide ( i.e., k>40), such as tantalum oxide ($Ta_2O_5$), which can be deposited by chemical vapor deposition. Most preferably, the high dielectric metal oxide is deposited by the same precursor as the metal oxide layer that is densified into the metal nitride layer. The densification process of the invention allows the same precursor to deposit the metal nitride adhesion layer 624 and the metal oxide dielectric layer 622 sequentially in the same chamber without the need to transfer the substrate to another chamber or processing tool. Alternatively, the metal oxide dielectric layer 622 may be deposited using reactive sputtering techniques in a HDP-PVD chamber. The dielectric layer 622 is preferably deposited to a thickness of between about 20 Å and about 200 Å, even more preferably between about 80 Å and about 100 Å.

The second adhesion/encapsulation layer 625 may optionally be deposited over the dielectric layer 622. Preferably, the second adhesion/encapsulation layer 625 comprises the same material as the first adhesion/encapsulation layer 624 (discussed above) and is deposited using the CVD deposition techniques and precursors as descrbed above for the first adhesion/encapsulation layer 624. It is believed that the materials listed above provide improved adhesion of the electrode material to the dielectric material because the adhesion/encapsulation layer comprises elements from the same or similar family of elements as the dielectric material. For example, a TaN based adhesion/encapsulation layer converted from $Ta_2O_5$ provides better adhesion to a $Ta_2O_5$ dielectric material.

To complete the trench capacitor 618, the second electrode 621 is formed over the second adhesion/encapsulation layer 625 in the trench structure. The material of the second electrode fills the trench structure and is connected to the source region 615 of the access transistor of the DRAM device. To complete the DRAM device, the access transistor 612 of the DRAM device is formed above or adjacent a top portion of the trench capacitor using techniques generally known in the art.

The first and second adhesion/encapsulation layers 624 and 625 protect the dielectric layer 622 during a subsequent anneal process used to increase the dielectric constant of the dielectric layer. The anneal process can be performed in a variety of anneal chambers, including conventional furnace anneal chambers and rapid thermal anneal chambers. Anneal chambers in general are well known and commercially available. An example of an anneal chamber is the RTP XEplus Centura® thermal processor available from Applied Materials, Inc., Santa Clara, Calif. The inventors also contemplate using other commercially available thermal processors from manufacturers such as Eaton Corporation Thermal Processing Systems, located in Peabody, Massachusetts. Preferably, the dielectric layer 622 is annealed at a temperature of between about 500° C. and about 800° C. for between about 30 seconds and 120 seconds in a rapid thermal anneal process furnace. If annealed in a conventional thermal anneal furnace, the dielectric layer 622 is preferably annealed at a temperature of between about 300° C. and about 600° C. for between about 5 minutes and 50 minutes.

In addition to applications as gate electrode liners, the present invention is useful in applications that benefit from an adhesion/encapsulation layer having a relatively higher dielectric constant than currently practiced barrier/adhesion layers. The layer composition and properties of the $TaN_x$ layers according to the invention provide a dielectric constant which can be about the same dielectric constant as the HDC materials, such as $Ta_2O_5$. A high dielectric constant barrier/adhesion layer can provides an overall effective interlayer dielectric constant of the adhesion layer, dielectric layer and encapsulation layer similar to the HDC material alone. Additionally, since the dielectric property of $TaN_x$ increases generally with the increase in the nitrogen content in these layer (i.e., where x>1), TaN layers of variable dielectric constants can be produced by varying the nitrating conditions to provide dielectric constants similar to the HDC materials. For example, one phase of tantalum nitride ($TaN_x$), nitrogen rich $Ta_3N_5$ is an insulative phase having a dielectric constant of 40 or higher, similar to the $Ta_2O_5$ dielectric constant of about 50 and greater.

Additionally, the inventors contemplate application of the trench capacitor according to the invention in a variety of DRAM designs in addition to the DRAM design shown for illustrative purposes in FIG. 6. For example, in one possible DRAM design, the access transistor can be disposed at a location directly above the trench capacitor.

While the foregoing is directed to the preferred embodiment of the present invention, other and ftuther embodiments of the invention may be devised without departing from the basic scope thereof, and the scope thereof is determined by the claims that follow.

What is claimed is:

1. A method for processing a substrate comprising:
   a. depositing a metal oxide film on the substrate; and
   b. exposing the metal oxide film to a nitrating gas to convert substancially all of the metal oxide film to a metal nitride film consisting essentially of metal atoms and nitrogen atoms.

2. The method of claim 1, wherein the metal oxide film comprises tantalum oxide and the metal nitride film comprises tantalum nitride ($Ta_xN_y$).

3. The method of claim 1, wherein the metal oxide film is deposited by chemical vapor deposition of a precursor selected from the group consisting of pentaethoxytantalum ($Ta(OC_2H_5)_5$), cyclopentane tantalum azide, tantalum pentacloride, $Ta(OCH_3)$, and combinations thereof.

4. The method of claim 1, wherein the nitrating gas is selected from the group consisting of nitrogen, ammonia, nitrous oxide, and combinations thereof.

5. The method of claim 4, wherein the nitrating gas further comprises a gas selected from the group consisting of oxygen, hydrogen, and combinations thereof.

6. The method of claim 1, wherein nitrating the metal oxide film comprises heating the metal oxide film at a temperature between about 200° C. and about 800° C. in the nitrating gas.

7. The method of claim 1, wherein nitrating the metal oxide film comprises generating a plasma by applying power to the processing chamber at between about 25 and about 2000 Watts.

8. A method for forming a microelectronic device, comprising:
   a. forming a first electrode;
   b. depositing a metal nitride layer over the first electrode, comprising:
      1. depositing a metal oxide layer on the substrate; and
      2. exposing the metal oxide layer to a nitrating gas to convert substancially all of the metal oxide film to the metal nitride layer consisting essentially of metal atoms and nitrogen atoms;
   c. depositing a dielectric layer over the metal nitride layer; and
   d. forming a second electrode over the dielectric layer.

9. The method of claim 8, wherein the metal oxide layer comprises tantalum oxide and the metal nitride layer comprises tantalum nitride.

10. The method of claim 8, wherein the metal oxide layer is deposited by chemical vapor deposition of a precursor selected from the group consisting of pentaethoxytantalum ($Ta(OC_2H_5)_5$), cyclopentane tantalum azide, tantalum pentacloride, $Ta(OCH_3)$, and combinations thereof.

11. The method of claim 8, wherein the nitrating gas is selected from the group consisting of nitrogen, ammonia, nitrous oxide, and combinations thereof.

12. The method of clann 11, wherein the nitrating gas further comprises a gas selected from the group consisting of oxygen, hydrogen, and combinations thereof.

13. The method of claim 12, wherein nitrating the metal oxide layer comprises heating the layer at a temperature between about 200° C. and about 800° C. in the nitrating gas.

14. The method of claim 8, wherein nitrating the metal oxide layer comprises striking a plasma, the plasma comprising capacitively or inductively coupling energy into a processing chamber at a power between about 25 and about 2000 Watts.

15. The method of claim 8, wherein the dielectric layer comprises a high dielectric constant material.

16. The method of claim 15, wherein the high dielectric constant material is tantalum oxide ($Ta_2O_5$).

17. The method of claim 8, wherein the metal nitride layer and the dielectric layer are deposited sequentially in the same chamber.

18. The method of claim 8, wherein the metal nitride layer and the dielectric layer are deposited from the same precursor.

19. The method of claim 8, further comprising annealing the substrate at between about 300° C. and about 600° C. for between about 5 minutes and about 50 minutes in a conventional anneal furnace.

20. The method of claim 8, further comprising annealing the substrate at between about 500° C. and about 800° C. for between about 30 seconds and about 120 seconds in a rapid thermal anneal processor.

21. The method of claim 8, further comprising:
   e. depositing a metal nitride layer between the dielectric layer and the second electrode, comprising:
      1. depositing a metal oxide layer on the substrate; and
      2. exposing the metal oxide layer to a nitrating gas to density the metal oxide layer to form the metal nitride layer.

22. The method of claim 21, wherein the metal oxide layer comprises tantalum oxide ($Ta_2O_5$) and the metal nitride layer comprises tantalum nitride ($Ta_xN_y$).

23. The method of claim 21, wherein the metal nitride layer and the dielectric layer are deposited from the same precursor.

* * * * *

UNITED STATES PATENT AND TRADEMARK OFFICE
CERTIFICATE OF CORRECTION

PATENT NO. : 6,319,766 B1
DATED : November 20, 2001
INVENTOR(S) : Bakli et al.

It is certified that error appears in the above-identified patent and that said Letters Patent is hereby corrected as shown below:

Title page, Item [54] and Column 1, line 2,
Please insert -- CVD -- after "NITRIDE".

Item [57], ABSTRACT,
Line 15, please replace "firer" with -- further --.

Column 2,
Line 17, please replace "adhesionlencapsulation" with -- adhesion/encapsulation --.
Line 45, please replace "PYD" with -- PVD --.
Line 46, please replace "adhesionlencapsulation" with -- adhesion/encapsulation --.

Column 4,
Line 8, please replace "forming the a" with -- forming a --.

Column 7,
Line 25, please replace "RP" with -- RF --.

Column 9,
Line 27, please replace "die" with -- the --.
Line 38, please replace "organometalfic" with -- organometallic --.

Column 10,
Line 3, please replace "RTP XFplus" with -- RTP XEplus --.

Column 11,
Line 21, please replace "of an" with -- of a --.

Signed and Sealed this

Thirtieth Day of July, 2002

Attest:

JAMES E. ROGAN
*Attesting Officer*   *Director of the United States Patent and Trademark Office*